United States Patent

Ni et al.

(10) Patent No.: US 7,463,038 B2
(45) Date of Patent: Dec. 9, 2008

(54) SLANT DETECTION DEVICE

(75) Inventors: Hsiao-Tsu Ni, Hsinchuang (TW); Yaw-Tzorng Tsorng, Kuei Shan Hsiang (TW); Chung-Ping Liu, Kuei Shan Hsiang (TW); Chen-Sheng Tang, Kuei Shan Hsiang (TW)

(73) Assignee: Quanta Computer Inc., Tao Yuan Shien (TW)

( * ) Notice: Subject to any disclaimer, the term of this patent is extended or adjusted under 35 U.S.C. 154(b) by 324 days.

(21) Appl. No.: 11/526,662

(22) Filed: Sep. 26, 2006

(65) Prior Publication Data

US 2007/0139052 A1 Jun. 21, 2007

(30) Foreign Application Priority Data

Dec. 15, 2005 (TW) ............... 94221894 U

(51) Int. Cl.
*G01R 31/04* (2006.01)
(52) U.S. Cl. .................. 324/538; 324/522; 324/761
(58) Field of Classification Search .......... 324/538, 324/522, 761; 439/912
See application file for complete search history.

(56) References Cited

U.S. PATENT DOCUMENTS

| 5,877,622 | A | * | 3/1999 | Aoyama et al. | .......... 324/158.1 |
|---|---|---|---|---|---|
| 5,926,026 | A | * | 7/1999 | Furuzawa et al. | .......... 324/538 |
| 6,407,568 | B1 | * | 6/2002 | Mulligan et al. | .......... 324/761 |
| 2003/0106604 | A1 | * | 6/2003 | Breen | .......... 140/147 |

* cited by examiner

*Primary Examiner*—Diego Gutierrez
*Assistant Examiner*—John Zhu
(74) *Attorney, Agent, or Firm*—Rabin & Berdo, PC

(57) ABSTRACT

A slant detection device is used for detecting whether the to-be-tested pin of a connector is slanted. The connector has a socket. The to-be-tested pin is disposed in the socket. The detection device includes a detector and a sensor. The detector includes a body, a first protrusion and a second protrusion. The first and second protrusions are protruded from one side of the body for being inserted into the socket. The first and second protrusions are spaced to define a gap. The width of the gap is greater than the width of the to-be-tested pin. If the pin is normal, the to-be-tested pin is inserted into the gap. If the to-be-tested pin is slanted, the to-be-tested pin touches the first or second protrusion to cause a short circuit. The sensor is electrically connected to the detector, for outputting a sensing signal when sensing the short circuit.

20 Claims, 2 Drawing Sheets

SLANT DETECTION DEVICE

This application claims the benefit of Taiwan application Serial No. 94221894, filed Dec. 15, 2005, the subject matter of which is incorporated herein by reference.

BACKGROUND OF THE INVENTION

1. Field of the Invention

The invention relates in general to a slant detection device, and more particularly to a slant detection device for detecting whether a pin of a connector is slanted.

2. Description of the Related Art

In order to differentiate the polarities, connection pins of a conventional power connector are typically designed as a longer ground pin and a number of shorter power pins. However, the longer ground pin is easily slanted during-transportation. In order to prevent the pin from being hit by an external force, the conventional design normally adopts an embedded socket for the pin to be disposed in the socket. Examples of the methods for detecting whether the ground pin is slanted include sight check and using an optical instrument.

However, the sight check method is lack of scientific evidences and totally depends on the subjective judgment of the inspector. Consequently, the results of detection are not reliable and have poor precision and accuracy. Furthermore, the method of using an optical instrument involves a complicated process of detection, and if the base is not precisely fixed, the results of measurement would be lack of precision, resulting in a waste in time and labor. Besides, the optical instrument is so expensive that the detection is not economic.

SUMMARY OF THE INVENTION

It is therefore an object of the invention to provide a slant detection device used for detecting if the to-be-tested pin of a connector is slanted. By incorporating the protrusion disposed on the detector with a simple circuit design of a sensor, the invention avoids the disadvantages occurring to conventional methods of sight check or using an optical instrument, hence increasing the efficiency, precision and accuracy in detecting.

The invention achieves the above-identified object by providing a slant detection device used for detecting whether the to-be-tested pin of a connector is slanted. The connector has a socket. The to-be-tested pin is disposed in the socket. The detection device includes a detector and the sensor. The detector includes a body, a first protrusion and a second protrusion. The first protrusion and the second protrusion are protruded from one side of the body and inserted into the socket. The first protrusion and the second protrusion are spaced to define a gap. The width of the gap is greater than the width of the to-be-tested pin. If the to-be-tested pin is normal, the to-be-tested pin is inserted into the gap. If the to-be-tested pin is slanted, the to-be-tested pin touches the first protrusion or the second protrusion to cause a short circuit. The sensor is electrically connected to the detector. The sensor outputs a sensing signal when sensing the short circuit.

The invention further achieves the above-identified object by providing a detection device of a power connector. The power connector has a socket, a number of power pins, and a ground pin. The ground pin is longer than the power pin. The ground pin and the power pin are both disposed in the socket. The detection device includes a detector and a sensor. The detector includes a body, a first protrusion and a second protrusion. The first protrusion and the second protrusion are protruded from one side of the body and inserted into the socket of the power connector so that the power pin is adjacent to the first protrusion or the second protrusion. The first protrusion and the second protrusion are spaced to define a gap. The width of the gap is greater than the width of the ground pin. If the ground pin is normal, the ground pin is inserted into the gap. If the ground pin is slanted, the ground pin touches the first protrusion or the second protrusion to cause a short circuit. The sensor is electrically connected to the detector When the sensor senses the short circuit, the sensor outputs a sensing signal.

Other objects, features, and advantages of the invention will become apparent from the following detailed description of the preferred but non-limiting embodiments. The following description is made with reference to the accompanying drawings.

DETAILED DESCRIPTION OF THE INVENTION

The main concept of the slant detection device according to the invention incorporates the design of protrusions and a gap with a simple sensing circuit to replace a complicated and expensive apparatus and increase the efficiency of detection. The invention disposes the apparatus in a power connector and is elaborated in a preferred embodiment disclosed below.

Figure 1:
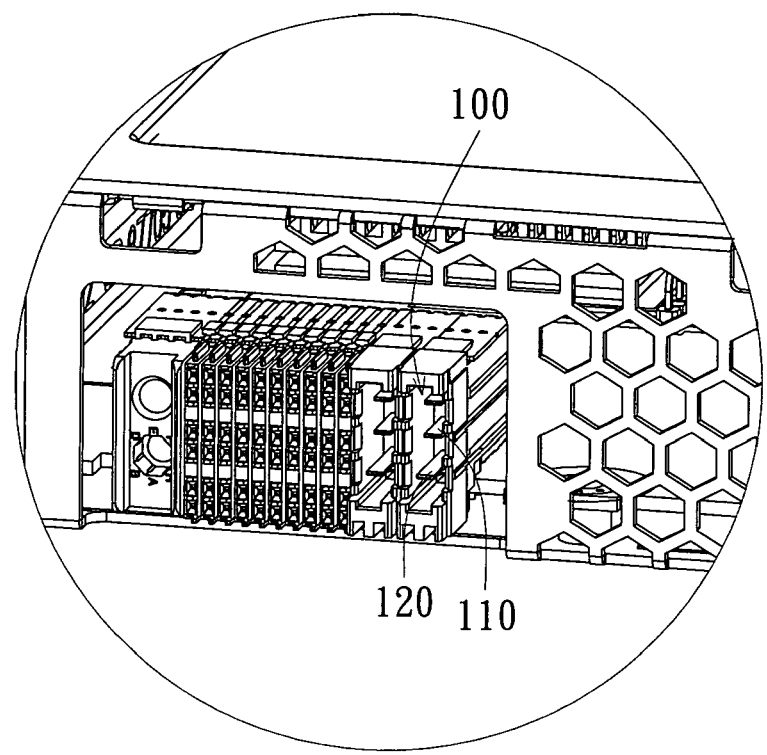
FIG. 1 illustrates a partial diagram of a power connector.

Referring to FIG. 1, a partial diagram of a power connector is shown. The power connector adopts an embedded socket 100. In order to differentiate the polarities, the connection pins of the power connector are normally designed as a longer ground pin 120 and a number of shorter power pins 110. The ground pin 120 and the shorter power pins 110 are disposed in the socket to protect the pins. The longer ground pin 120 is easily slanted during transportation, so the ground pin 120 is regarded as a to-be-tested pin.

Figure 2:
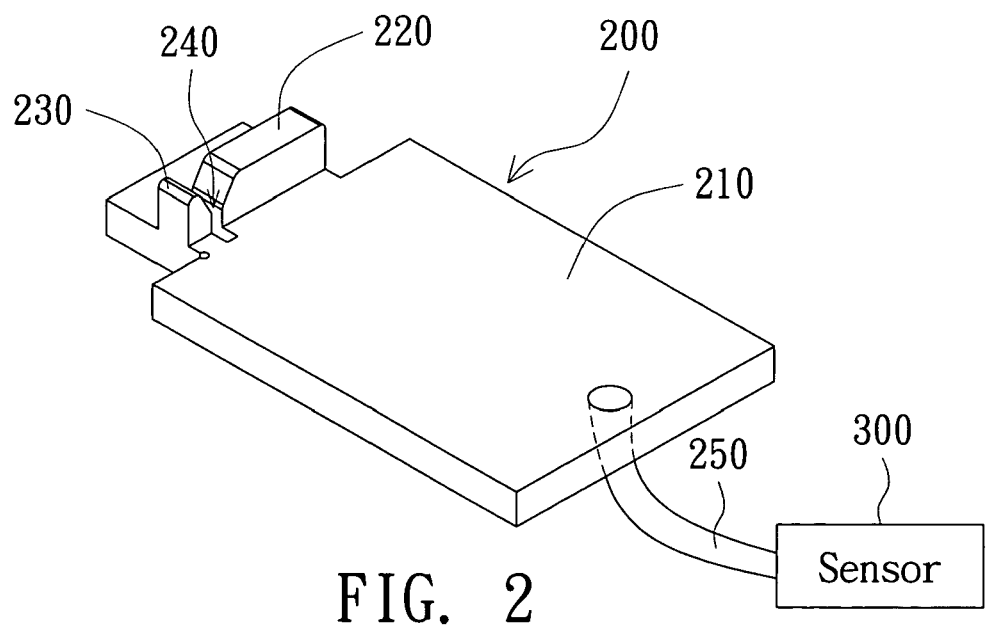
FIG. 2 illustrates a perspective diagram of a slant detection device according to a preferred embodiment of the invention.

Referring to FIG. 2, a perspective diagram of a slant detection device according to a preferred embodiment of the invention is shown. The detection device includes a detector 200 and a sensor 300. The sensor 300 is electrically connected to the detector 200. For example, the sensor 300 is connected the detector 200 via a conductive wire 250. The detector 200 includes a body 210, a first protrusion 220 and a second protrusion 230. The body 210 has a holding portion for the inspector to hold during detection. The holding portion is preferably a plate, so that the plate can abut the casing to increase the stability of the detection device as shown in FIG. 2. The first protrusion 220 and the second protrusion 230 are protruded from one side of the body 210 and inserted into the embedded socket 100 of the power connector. Therefore, the size of the first protrusion 220 and the size of the second protrusion 230 have to have interference fit with the socket 100 so as to increase the precision of the detection device. Besides, the first protrusion 220 and the second protrusion 230 are spaced to define a gap 240. The gap 240 is used for detecting whether the ground pin 120 is slanted, so the width of the gap 240 has to be greater than the width of the ground pin 120.

Figure 3:
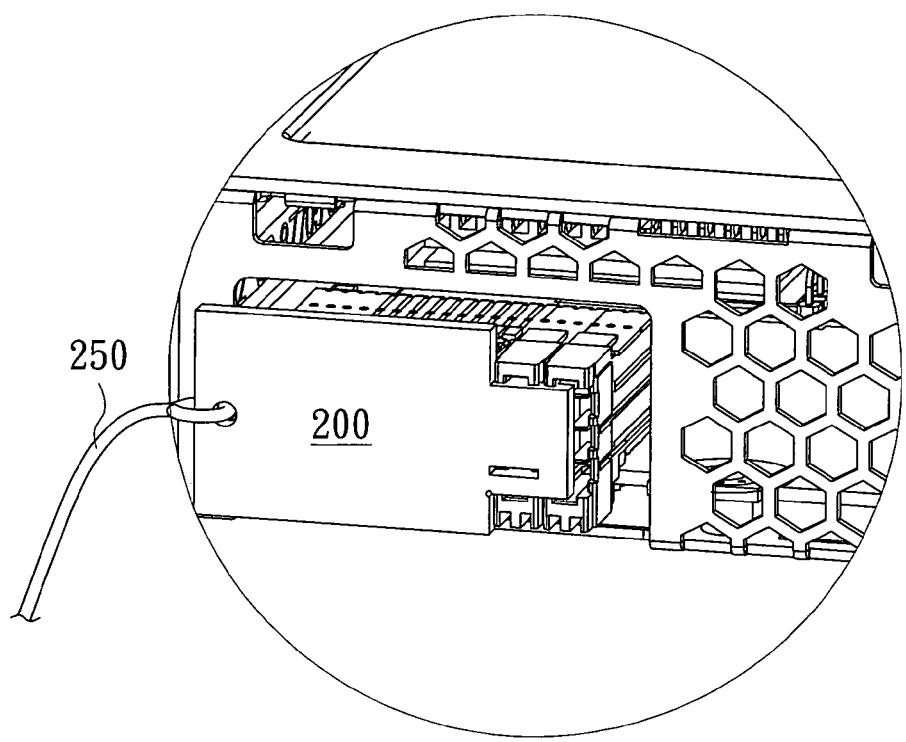
FIG. 3 illustrates a partial diagram of the slant detection device according to a preferred embodiment of the invention when in a checking state.
Figure 4:
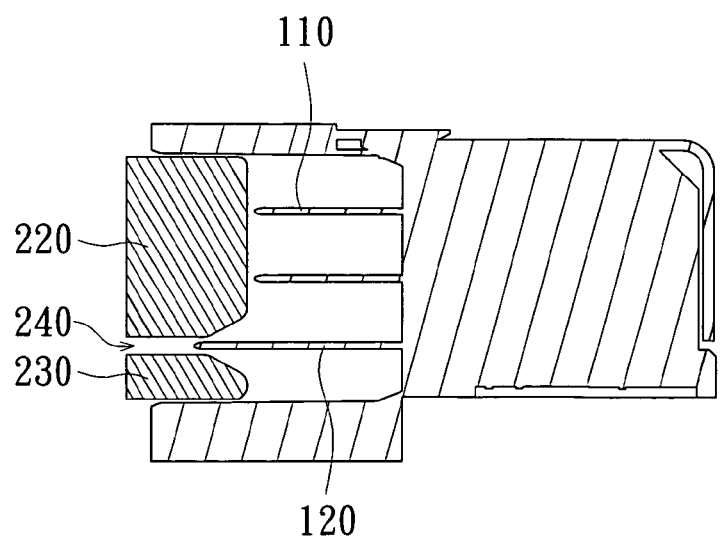
FIG. 4 illustrates a cross-sectional view of the slant detection device according to a preferred embodiment of the invention when in a checking state.

Referring to both FIG. 3 and FIG. 4, FIG. 3 is a partial diagram illustrating the slant detection device according to a preferred embodiment of the invention when in a checking state, and FIG. 4 is a cross-sectional view of the slant detection device according to a preferred embodiment of the invention when in a checking state. During detection, after the first protrusion 220 and the second protrusion 230 are both inserted into the socket of the power connector 100, if the ground pin 120 disposed inside the socket 100 is normal, the ground pin 120 is inserted into the gap 240. The ground pin 120 will not touch the first protrusion 220 or the second protrusion 230 for enabling the power pin 110 to be adjacent to the first protrusion 220 or the second protrusion 230. If the ground pin 120 disposed inside the socket 100 is slanted, the ground pin 120 will touches the first protrusion 220 or the second protrusion 230. Since both the first protrusion 220 and the second protrusion 230 are conductive protrusions, the detector 200 causes a short circuit and become turned on when the first protrusion 220 or the second protrusion 230 touches the ground pin 120. Meanwhile, the sensor 300 in FIG. 2 senses the detector 200 to be a short circuit and outputs a sensing signal. Examples of the sensor 300 include an electric meter, a light emitter, or other devices capable of sensing a short circuit and outputting a sensing signal. For example, if the sensor is an electric meter, the sensing signal is an electrical signal, and the electric meter will send a sound to inform the inspector that the to-be-tested pin is failed in the test. If the sensor is a light emitter such as a lamp or a light emitting diode (LED), the sensing signal is an optical signal, and the light emitter will emit a light to inform the inspector that the to-be-tested pin is failed in the test. The sensing signal can be a sound signal for informing the inspector that the to-be-tested pin is failed in the test.

However, any one who is skilled in the technology of the present embodiment of the invention will understand that the technology of the present embodiment of the invention is not limited thereto. The detection device is applicable to the slant detection of various connector pins such as the power connector of a blade server or the power plug of an electronic appliance. Besides, if the current to be transmitted is high, the pin can be changed to a metallic resilient piece. In terms of manufacturing, the detector can be formed in one piece or manufactured as a flexible protrusion. Since steel material is durable, cheap and easy for processing, the detector is preferably integrally formed in one piece. In practical application, the detectors are formed into protrusions having various sizes and gaps according to the socket size of the connector and the width of the to-be-tested pin. Besides, the position of the gap can be adjusted according to the relative position of the longer to-be-tested pin and other shorter pins.

The slant detection device disclosed in the above embodiment of the invention has the following advantages.

(1) Low cost: The detector can be integrally formed in one piece and include durable material such as steel, therefore there is no need to use expensive optical instrument and the manufacturing cost is decreased.

(2) High precision: The protrusion of the detector contacts the to-be-tested pin so the inspection range is reduced. The interference fit between the protrusion and the socket enhances the fixation, hence increasing the precision.

(3) Quick detection: The slant detection device with simple circuit design comprises the detector and the sensor. The result of detection can be obtained without complicated analysis and calculation. When the pin is slanted, the sensor directly outputs a sensing signal, and the result of detection is obtained instantly.

(4) Easy operation: The operation of detection is simple and easy without using complicated process or expertise. An inspector can learn the operation of detection without having professional expertise or skillful training.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A slant detection device used for detecting whether a to-be-tested pin of a connector is slanted, wherein the connector has a socket, the to-be-tested pin is disposed inside the socket, and the detection device comprises:
   a detector, comprising:
      a body; and
      a first protrusion and a second protrusion both protruded from one side of the body and inserted into the socket, wherein the first protrusion and the second protrusion are spaced to define a gap, a width of the gap is greater than a width of the to-be-tested pin, the to-be-tested pin is inserted into the gap if the to-be-tested pin is normal, and the to-be-tested pin touches the first protrusion or the second protrusion to cause a short circuit if the to-be-tested pin is slanted; and
   a sensor electrically connected to the detector, wherein, when the sensor senses the short circuit, the sensor outputs a sensing signal.

2. The slant detection device according to claim 1, wherein the body comprises a holding portion.

3. The slant detection device according to claim 2, wherein the holding portion is a plate.

4. The slant detection device according to claim 3, wherein the connector is disposed inside a casing, and when the first protrusion and the second protrusion are completely inserted into the socket, the plate abuts the casing.

5. The slant detection device according to claim 1, wherein the first protrusion and the second protrusion are conductive protrusions.

6. The slant detection device according to claim 1, wherein the body, the first protrusion, and the second protrusion are integrally formed in one piece.

7. The slant detection device according to claim 1, wherein the sensor is an electric meter, and the sensing signal is an electrical signal.

8. The slant detection device according to claim 1, wherein the sensor is a light emitter, and the sensing signal is an optical signal.

9. The slant detection device according to claim 1, wherein the sensing signal is a sound signal.

10. The slant detection device according to claim 1, wherein the connector further comprises a plurality of pins disposed inside the socket, the to-be-tested pin is longer than the pins so that when detecting the to-be-tested pin, the pins are adjacent to the first protrusion or the second protrusion.

11. A detection device of a power connector, wherein the power connector has a socket, a plurality of power pins, and a ground pin, the ground pin is longer than the power pins, the ground pin and the power pins are disposed inside the socket, and the detection device comprises:
   a detector, comprising:
      a body; and
      a first protrusion and a second protrusion both protruded from one side of the body and inserted into the socket of the power connector so that the power pins is adjacent to the first protrusion or the second protrusion, wherein the first protrusion and the second protrusion are spaced to define a gap, a width of the gap is greater than a width of the ground pin, the ground pin is inserted into the gap if the ground pin is normal, and the ground pin touches the first protrusion or the second protrusion to cause a short circuit if the ground pin is slanted; and a sensor electrically connected to the detector, wherein when the sensor senses the short circuit, the sensor outputs a sensing signal.

12. The detection device according to claim 11, wherein the body comprises a holding portion.

13. The detection device according to claim 12, wherein the holding portion is a plate.

14. The detection device according to claim 13, wherein the power connector is disposed inside a casing, and when the first protrusion and the second protrusion are completely inserted into the socket, the plate abuts the casing.

15. The detection device according to claim 11, wherein the body, the first protrusion, and the second protrusion are integrally formed in one piece.

16. The detection device according to claim 11, wherein the first protrusion and the second protrusion are conductive protrusions.

17. The detection device according to claim 16, wherein the ground pin is a metallicresilient piece.

18. The detection device according to claim 11, wherein the sensor is an electric meter, and the sensing signal is an electrical signal.

19. The detection device according to claim 11, wherein the sensor is a light emitter and the sensing signal is an optical signal.

20. The detection device according to claim 11, wherein the sensing signal is a sound signal.

* * * * *